United States Patent
Neyer et al.

(10) Patent No.: US 10,974,399 B2
(45) Date of Patent: Apr. 13, 2021

(54) METHOD FOR DETERMINING THE TIME BEHAVIOR OF A CYCLIC MOTOR PROCESS DURING USE OF AN ELECTRICAL HAIR REMOVAL DEVICE AND HAIR REMOVAL DEVICE

(71) Applicant: Braun GmbH, Kronberg (DE)

(72) Inventors: Christian Neyer, Eschborn (DE); Bernhard Kraus, Braunfels (DE)

(73) Assignee: Braun GMBH, Kronberg (DE)

( * ) Notice: Subject to any disclaimer, the term of this patent is extended or adjusted under 35 U.S.C. 154(b) by 30 days.

(21) Appl. No.: 16/031,054

(22) Filed: Jul. 10, 2018

(65) Prior Publication Data

US 2019/0015998 A1 Jan. 17, 2019

(30) Foreign Application Priority Data

Jul. 14, 2017 (EP) .................................... 17181427

(51) Int. Cl.
  H02P 6/14 (2016.01)
  G01R 31/34 (2020.01)
  (Continued)

(52) U.S. Cl.
  CPC ............ B26B 19/388 (2013.01); A45D 26/00 (2013.01); G01R 19/0092 (2013.01);
  (Continued)

(58) Field of Classification Search
  CPC . A45D 26/00; H02P 6/14; H02P 6/006; H02P 6/182; H02P 27/085;
  (Continued)

(56) References Cited

U.S. PATENT DOCUMENTS

| 4,469,998 A | * | 9/1984 | Nola | ...................... H02J 3/1892 318/729 |
| 4,490,666 A | * | 12/1984 | Tanamachi | ............ H02M 7/527 318/800 |

(Continued)

FOREIGN PATENT DOCUMENTS

| CN | 1270094 A | 10/2000 |
| CN | 1288285 A | 3/2001 |

(Continued)

OTHER PUBLICATIONS

Padmaraja Yedamale; "Using the PIC18F2431 for Sensorless BLDC Motor Control"; Microchip AN970; Microchip Technology Inc.; Feb. 7, 2005; https://www.microchip.com/wwwAppNotes/AppNotes.aspx?appnote=en022169.

(Continued)

*Primary Examiner* — Ghassem Alie

(74) *Attorney, Agent, or Firm* — Kevin C. Johnson; Gerd Zetterer

(57) ABSTRACT

Electrical hair removal device and method for determining the time behavior of a cyclic motor process during use of the electrical hair removal device with a motor-driven hair cutting unit by measuring the motor current. Parallel to measuring the motor current, the induced voltage of the motor is measured and a timing property of the induced voltage is evaluated, wherein the duration of a time pattern in the induced voltage is analyzed as timing property of the induced voltage. A cutting activity of the electrical hair removal device during use is determined based on the evaluated timing property of the induced voltage, and a force applied onto skin during use of the electrical hair removal device is determined based on the measured motor current and, optionally, on the determined cutting activity.

17 Claims, 2 Drawing Sheets

(51) Int. Cl.
*G01R 19/00* (2006.01)
*A45D 26/00* (2006.01)
*B26B 19/38* (2006.01)
B26B 19/28 (2006.01)
B26B 19/46 (2006.01)
H02P 6/00 (2016.01)

(52) U.S. Cl.
CPC .............. *G01R 31/343* (2013.01); *H02P 6/14* (2013.01); *B26B 19/282* (2013.01); *B26B 19/3886* (2013.01); *B26B 19/46* (2013.01); *H02P 6/006* (2013.01)

(58) Field of Classification Search
CPC .. G01R 19/0092; G01R 3/343; B26B 19/282; B26B 19/388; B26B 19/3886; B26B 19/46; B26B 6/182; B26B 19/28; B26B 19/18; B26B 21/34; H02O 6/08; H02K 23/16
USPC .......................................... 83/13; 30/43.7, 45
See application file for complete search history.

(56) References Cited

U.S. PATENT DOCUMENTS

| | | | | |
|---|---|---|---|---|
| 4,879,497 | A * | 11/1989 | Meyer | G01K 7/20 318/400.08 |
| 5,274,735 | A | 12/1993 | Okada | |
| 8,878,482 | B2 * | 11/2014 | Kojima | H02M 7/797 318/803 |
| 2002/0108251 | A1 * | 8/2002 | Brum | B26B 19/28 30/43.7 |
| 2016/0181955 | A1 * | 6/2016 | Suzuki | H02M 7/00 318/400.04 |
| 2018/0231589 | A1 * | 8/2018 | Seon | G01R 19/0092 |
| 2019/0052198 | A1 * | 2/2019 | Hano | H02P 29/66 |
| 2019/0173411 | A1 * | 6/2019 | Jung | H02M 7/53871 |

FOREIGN PATENT DOCUMENTS

| | | |
|---|---|---|
| CN | 104379309 A | 2/2015 |
| DE | 102005045800 A1 | 4/2007 |
| EP | 0719222 B1 | 11/1998 |
| EP | 2875918 A1 | 5/2015 |
| JP | 2002239270 A | 8/2002 |
| JP | 2006288892 A | 10/2006 |
| JP | 2010227226 A | 10/2010 |
| JP | 4919247 B2 | 4/2012 |
| JP | 2014023274 A | 2/2014 |
| JP | 2014151124 A | 8/2014 |
| JP | 2017506968 A | 3/2017 |
| WO | 2008112753 A1 | 9/2008 |
| WO | 2015135682 A1 | 9/2015 |

OTHER PUBLICATIONS

Padmaraja Yedamale; "Brushless DC (BLDC) Motor Fundamentals"; Microchip AN885; Microchip Technology Inc.; Nov. 11, 2003; www.microchip.com/wwwAppNotes/Appnotes.aspx?appnote=en012127.

Electric Shaver Brushless Motor/Personal Care—BLDC Motor for Electric Shaver; Shenzhen Hengdrive Electric Co.,. Ltd; Retrieved from http://en.hengdrive.com/Products/ElectricShaverMotor.html on Aug. 9, 2019.

1pc Three Phase Outer Rotor Micro Brushless DC Motor for Electric Shavers; Ali Express Tool Light Market Store;. Retrieved from https://www.aliexpress.com/item/32850879901.html on Aug. 9, 2019.

Brushless DC Motors; Portescap; Retrieved from https://www.portescap.com/products/brushless-dc-motor; 2018.

Brushless DC Electric Motor; Wikipedia; Retrieved from https://en.wikipedia.org/wiki/Brushless_DC_electric_motor on Aug. 9, 2019.

Communication pursuant to Rule 114(2) EPC; European Patent Application No. 17181427.0; dated Aug. 26, 2019; European Patent Office; Munich, Germany.

Search Report; Chinese Patent Application No. 2018107679717; dated Jan. 13, 2020; Chinese Patent Office; Beijing, China.

Cosmin Cardan; Extended European Search Report; European Patent Application No. 17181427.0; dated Jan. 18, 2018; European Patent Office; Munich, Germany.

Search Report (search performed by AIRI); Japanese Patent Application No. 2018-134359; dated Jun. 13, 2019; Japan Patent Office; Tokyo, Japan.

* cited by examiner

METHOD FOR DETERMINING THE TIME BEHAVIOR OF A CYCLIC MOTOR PROCESS DURING USE OF AN ELECTRICAL HAIR REMOVAL DEVICE AND HAIR REMOVAL DEVICE

FIELD OF THE INVENTION

The invention relates to a method for determining the time behavior of a cyclic motor process during use of an electrical hair removal device such as an electrical shaver or epilator. Such devices are house hold appliances used in daily life.

BACKGROUND OF THE INVENTION

The EP 0 719 222 B1 discloses a shaving apparatus with at least one cutting unit which is provided with an external cutting member with at least one hair trap opening and an internal cutting member which can be driven relative to the external cutting member by an electric motor, the motor having a speed which is controllable by means of an electrical control unit. The apparatus comprises at least one transducer, and an electrical control unit is proposed as a feedforward control unit which varies the motor speed in accordance with a predetermined control rule as a function of at least one physical quantity which is measurable by means of said transducer. The physical quantity measured by means of the transducer is a quantity which changes during a shaving operation and which affects the shaving performance, shaving comfort, and power consumption. For measuring a number of hairs cut by the cutting unit per unit time, the transducer is provided with a microphone capable of detecting an acoustic signal produced by the cutting unit. Another transducer is capable of measuring a skin contact force exerted on the cutting unit, the detector being an usual strain gauge sensor. However, for the measurements many different transducers or sensors are required. These are expensive and need extra space in the device.

In the WO2015135682A1 a shaver is proposed that reduces power consumption in the absence of skin, without the use of a distance sensor. By measuring the power consumption of the motor, the load detector is able to detect skin contact, assuming that in case of skin contact the power used by the motor is relatively high. So, by measuring e.g. the current through the motor, skin contact of the shaver is detected without the need for an additional distance sensor. This is, however, not a precise determination of a skin contact.

SUMMARY OF THE INVENTION

It is an object of the invention to propose a possibility for determining the time behavior of a cyclic motor process during use of an electrical hair removal device without using specific sensors. It is a further object of the invention to determine more precisely the cutting activity and/or the force applied onto the skin by regular current and voltage sensors that already may be used by the device control unit for controlling the electrical motor of the hair removal device.

For determining the time behavior of a cyclic motor process during use of an electrical hair removal device with a motor-driven hair cutting unit, both the motor current and the induced voltage of the motor are measured, and a timing property of the induced voltage is evaluated, wherein the duration of a time pattern in the induced voltage is analyzed as timing property of the induced voltage.

According to the proposal, a cutting activity of the electrical hair removal device can be determined based on the evaluated timing property of the induced voltage. Further, a force applied onto the skin during use of the electrical hair removal device can be determined based on the measured motor current and, optionally, the cutting activity.

Further, the proposal relates to an electrical hair removal device, such as an electrical shaver or epilator, with a hair cutting unit, an electrical motor and a device control unit for driving the electrical motor, the device control comprising a processor (e.g. a microprocessor) adapted to drive the electrical motor. The device control unit is connected with a power source such as a battery or secondary battery, and has a control switch for switching on and off the electrical hair removal device. The device control unit comprises further a measuring unit for measuring the motor current and the induced voltage of the electrical motor, and the processor is adapted to perform the method described before.

DETAILED DESCRIPTION OF THE INVENTION

Figure 1:
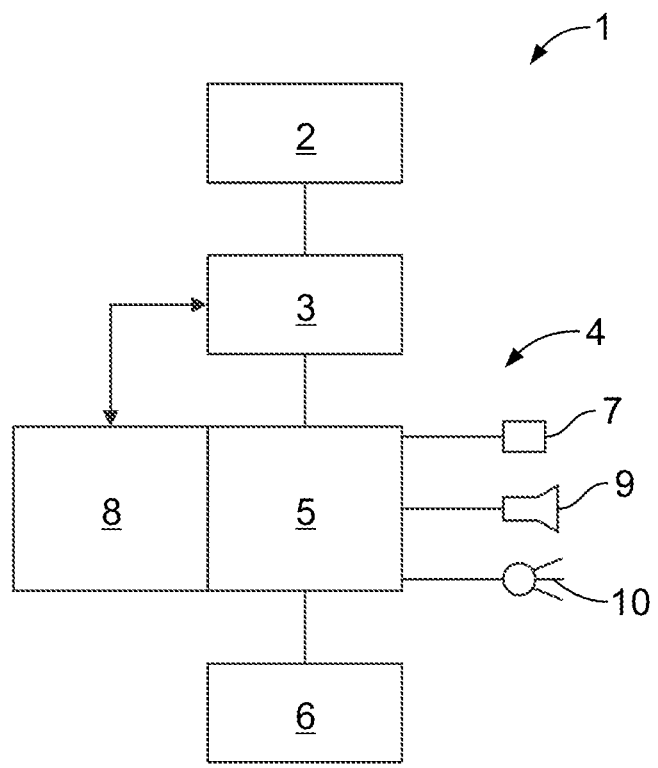
FIG. 1 shows a schematic sketch of a hair removal device according to an embodiment of the proposal.

Before describing advantageous embodiments of the invention related to the FIGS. 1 to 4, different aspects of the invention are described more in detail. These aspects disclose further features, advantages and possibilities of use of the present invention that might be combined in any useful combination. All features described and/or shown in the drawings are subject matter of the invention, irrespective of grouping the features in the claims and/or the claim references.

The invention is described with reference to an electrical shaver as hair removal device. Accordingly, in the below description, the terms "hair removal device" and "electrical shaver" are used synonymously, and also comprise an electrical epilator as hair removal device. The term "hair cutting unit" is to be understood as a "hair removal unit" for cutting and/or tearing out hairs. The same applies to the term "cutting activity" that may be understood as "tearing out activity" in case of an epilator as hair removal tool.

The cutting activity is a magnitude that increases with the power needed for cutting or tearing out hair. Reflecting the respective physical process, the magnitude "cutting activity" depends on at least one or all of the following influences: number of cutting events per time, hair thickness, hair dryness and bluntness of the cutting elements. In other words, the cutting activity is a measure describing the number of the cutting events and the power needed for the cutting. In line with the proposal, the cutting activity might be described based on or using the timing property of the induced voltage. Possible embodiments are described more in detail in the following. A common feature of the timing properties of the proposal is that they are suited to describe a cyclic behavior of the motor, for example the behavior of a half cycle of the induced voltage.

For determining the time behavior of a cyclic motor process during use of an electrical shaver, the motor current and the induced voltage of the motor are measured, and a timing property of the induced voltage is evaluated. The cutting activity of the electrical hair removal device is then determined based on the evaluated timing property of the induced voltage, and the force applied onto the skin during use of the electrical hair removal device is determined based on the measured motor current and (optionally) the cutting activity. Thus, in line with the proposal, the force applied onto the skin and/or the cutting activity of an electrical shaver are extracted out of electrical values related to the motor of the electrical shaver, and in particular related to a cyclic motor process during use. The induced voltage and the current of the motor can be measured without specific sensors for evaluating e.g. positions of the hair cutting unit or parts thereof and/or cutting sounds, such as a microphone.

The motor current and properties of the induced voltage are measured, for example the pulse shape of the motor induced voltage. The value of the force that is applied onto the skin by the electrical shaver is calculated out of these magnitudes. The cutting activity, i.e. a measure for the amount of hair cutting events per unit of time of the electrical shaver, is calculated as well. No dedicated sensor is needed. The measurements and calculations are done during the operation of the shaver and the results are available immediately, i.e. within a short delay of typically a few oscillations or rotations of the shavers cutting system. Instead of using separate sensors for directly measuring the force that is applied by the electrical shaver onto the skin and also measuring how heavily the shaver cuts hair, it is proposed to obtain a measure for the force and also for the cutting activity of the electrical shaver out of electrical magnitudes that are delivered by the motor of the shaver itself. Other separate sensors would add a lot of complexity to the electrical shaver, and can be avoided with the proposal.

The induced voltage reflects very well the mechanical movement of the motor. So, it contains information about mechanical influences that change the movement compared to the undisturbed case. A cutting event will e.g. slow down the movement of the motor. In the simplest case, this slow down can be seen directly as a decrease of the level of the induced voltage. This is not always possible, e.g. because the inertia of the motor is too high. However, a slowdown still takes place.

A method to determine this slowdown is to evaluate timing properties of the induced voltage. For rotating motors, a delay as a consequence of the slowing down can be expected. For linear motors running in a mechanical resonance, a delay as well as the opposite is possible. On the long term, i.e. over several motor turns or oscillation cycles, a positive or negative delay may disappear, because there may be a motor control that compensates it after some time. So, it is proposed according to a preferred embodiment to measure single pulses of the induced voltage and to evaluate their behavior in time for evaluating the timing property of the induced voltage which is then a timing property of a single pulse of the measured induced voltage.

As timing property of the induced voltage, the duration in time of a time pattern in the induced voltage (or induced voltage signal) may be analyzed according to an embodiment of the proposal. A time pattern in the induced voltage means a periodic (or cyclic, which terms are used in an equivalent meaning in this description) behavior of the induced voltage that can be evaluated in the measured induced voltage of the motor, i.e. in an induced voltage signal.

The induced voltage, and in particular a specific time duration derivable from the voltage signal as a timing property value within the course of the induced voltage, contains additional information, not included in the value of the motor current. The different kinds of mechanical load lead to different influences and distortions in time related (timing) properties of the induced voltage.

One typical kind of load is caused by the force onto the skin. This load is friction between the different elements of the shaver's cutting system. This load is quite evenly distributed over time, without sudden extremes. The scenario is, however, completely different when the load is due to hair cutting events. The load is then not evenly distributed over time, but fluctuates, due to the cutting of single hairs.

For understanding the influence of cutting events on the induced voltage and its timing characteristics (timing properties) more in detail, simulations and measurements have shown that the consequences of a hair being cut can be more complex than just a decrease of the induced voltage, and a sudden jump of the induced voltage may not appear. This is mainly due to two reasons:

The amount of stored kinetic energy (energy due to the mechanical velocity of motor components) is high compared to the energy needed to cut a (single) hair, and the connection of the motor to the cutting elements has a limited value of stiffness, and the motor movement is not immediately influenced.

Figure 3:
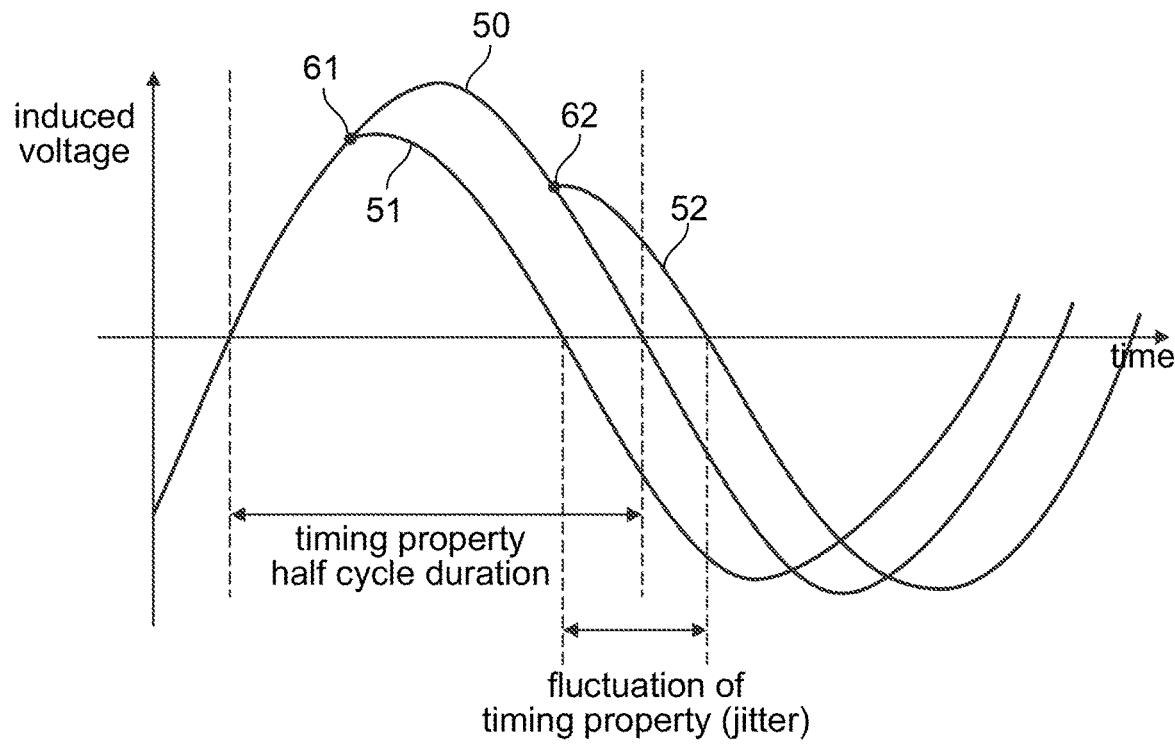
FIG. 3 shows a full cycle of the induced voltage of the motor as measured for evaluating a timing property of the induced voltage according to an embodiment of the proposal.

As mentioned, the loss of energy due to cutting results in every case in some slowing down of the motor motion. As a consequence, the periodic pattern of the induced voltage of the motor is changed. Some characteristic time pattern in the induced voltage will last for a time duration that is different compared to the case without a cutting event. An example of such a pattern is a half cycle of the induced voltage. It may look as it is indicated in FIG. 3. Thus, according to a preferred embodiment of the proposal, the time pattern may be a half cycle of the induced voltage.

The (time related) timing property may be e.g. the time difference between two zero crossings, i.e. the time duration of the half cycle of the induce voltage. This value is indicated in FIG. 3 showing the induced voltage signal 50 without a cutting event. The timing property can also be denoted as "measured time value", and will be used within the description in this sense.

FIG. 3 also represents the induced voltage signal 51 for a cutting event 61 in the rising slope of the voltage signal. In this case, the half cycle duration of the induced voltage signal 51 is shortened compared to the induced voltage signal 50. A further induced voltage signal 52 represents a cutting event 62 in the falling slope of the voltage signal, leading to a prolonged half cycle duration. This leads to fluctuation (jitter) of the timing property (half cycle duration) as indicated in FIG. 3 indicative of cutting events. The fluctuation/jitter is thus a suited measure for the cutting activity.

It might be intuitive to expect a prolongation of such a time pattern in the induced voltage signal (due to slowing down the motor). This is valid for a rotational motor. However, in a linear motor working in mechanical resonance, also a shortening of the pattern can appear, depending on the moment in time, when the cutting events happens. One example is explained above referring to FIG. 3.

A shortening may also happen as a consequence of a motor control, which may hold the average speed or frequency of the motor constant and will then compensate for a prolonged cycle by producing shorter, faster control cycles. It is important to note that the duration of specific patterns in the induced voltage of the turning or linear motor is changed by cutting events. The sign, positive or negative, is of less importance. Accordingly, the proposal is working very well with both, rotation motors and linear motors as well.

Another aspect to consider for analyzing the induced voltage signal is the distribution of cutting events over time. It turns out, that cutting events are not evenly distributed over time during a shave, and even not during a short time period of the shave. To the contrary, the cutting events are distributed randomly or at least non-uniformly in time.

It is, therefore, proposed according an embodiment that fluctuations in the evaluated timing property during use of the electrical hair removal device are determined as a measure for the cutting activity. The duration of specific time patterns in the induced voltage will fluctuate in time during a cutting activity, i.e. during use of the electrical shaver. A jitter of the timing property can then be observed in the evaluated signal. Thus, jitter may be used as a key feature to quantify the cutting activity of the shaver and to determine, which amount (or part) of motor current is used for cutting hair (in contrast to the motor current for e.g. moving the cutting system in the hair cutting unit). It is important to note, that such jitter is not observed when the shaver is just experiencing pressure onto its cutting system without cutting hair.

The extraction of the time related properties (timing properties) may include common methods like interpolation or others. It may also make use of algorithms that run in the already existing motor control anyway. An essential idea of the proposal is to extract a defined time value from the induced voltage signal and use this time value (time information) as timing property for further analysis.

An example for such time information is the distance in time between the zero crossing of the induced voltage from negative to positive values and/or the next zero crossing from positive to negative values. It may be called a half cycle duration. This timing property can be evaluated simply by testing the induced voltage signal with a comparator thus detecting the zero crossings of the induced voltage signal, and counting the time between consecutive zero crossings, as evident from FIG. 3.

Another example for evaluation such time information is often already implemented in an electrical shaver with a linear motor. It makes use of the already existing motor control and measures the time distance between two particular events in the electronics of the motor driver or device control unit, i.e. the time duration between the end of the motor drive pulse that drives current through the motor in one direction and the end of the motor drive pulse that drives current through the motor in the other direction. This time duration is denoted as a half cycle or half cycle duration of the motor operation, or the induced voltage respectively, as well.

Evaluating the half cycle of the induced voltage is proposed according to an embodiment, because the time jitter is particularly pronounced during cutting activity of the shaver and can be determined clearly by comparing time behavior of the half cycle (i.e. the half cycle duration) as timing property.

For analyzing the extracted time duration value (e.g. half cycle of the induce voltage) as timing property, it is useful to store a number of measured time duration values (evaluated timing properties) from previous motor oscillation cycles or turns during use of the electric shaver, and to update this collection with every cycle or turn. The fluctuations of this time value (i.e. the previously described jitter, or more generally the timing property) are according to the proposal quantified in some way to have a measure for the cutting activity of the electrical shaver. Known statistical or mathematical methods, that are suitable for quantifying fluctuations (or volatility), can be applied here. Some examples are given in the following:

Determining the standard deviation of the timing properties However, this might not be optimal, because trends in the data points due to other systematic reasons might increase the value obtained for the standard deviation leading to an uncertainty for the cutting activity.

Determining the standard deviation of the difference of the timing properties between adjacent measurements, for example for a certain number of consecutively evaluated half cycles as timing properties (e.g. half cycle durations) vs. time (or the number of motor oscillation cycles or turns).
This leads to better results for the cutting activity with respect to the before described alternative as longer term systematic effects do not influence the value for the cutting activity significantly.

Determining the differential nonlinearity of a line that connects the evaluated timing properties (e.g. half cycle duration) as a function of time in a two-dimensional plot. The (time dependent) differential nonlinearity is a suited measure for the fluctuations in time.

According to the proposal, several timing properties of the induced voltage may be continuously evaluated and stored during use of the electrical hair removal device, for example during one single use defined as the period from switching on the electric hair removal device until switching it off, and the fluctuations of the stored evaluated timing properties are quantified as the measure for the cutting activity.

Figure 4:
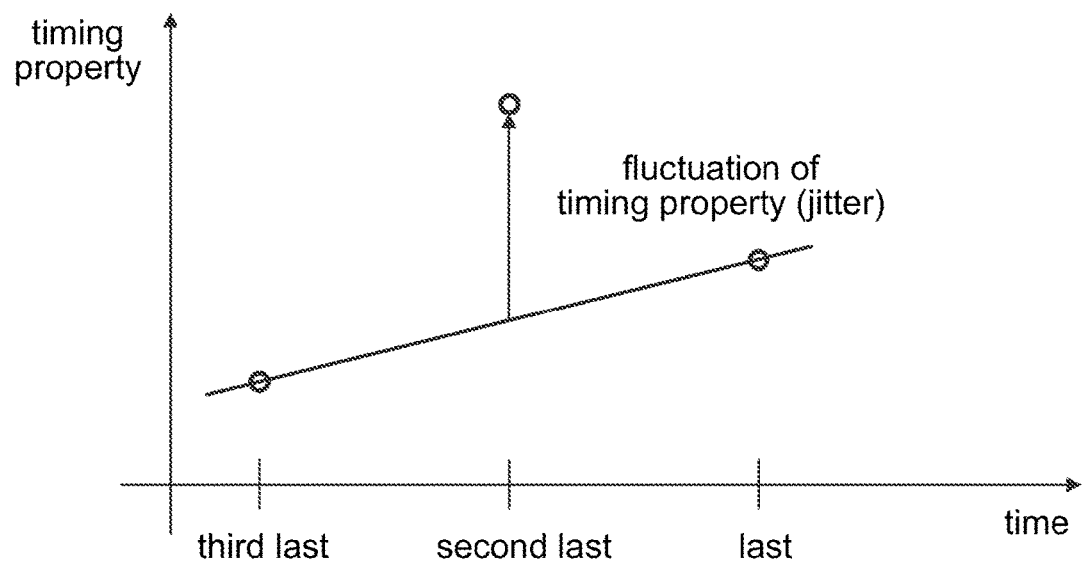
FIG. 4 shows a graph with a proposed determination of fluctuations of the stored evaluated timing properties according to an embodiment of the proposal.

As a specific example in line with the proposal, at least three or exactly three evaluated timing properties (such as the duration of the half cycle) are chosen as a function of measuring time. It may be preferred to choose the (in time) last three evaluated timing properties. A linear regression as a function of time may be made with the first and the third timing properties, and the difference between the value of the second timing property and the functional value of the linear regression for the time of measuring the induce voltage for evaluating the second timing property may be quantified as measure for the cutting activity (equivalent to the jitter of the timing property). In other words, the timing properties (half cycle duration as measured time values) may be considered as dots in a graph showing the timing properties (measured time values) as a function of time, i.e. depending on their evaluation time from the induced voltage signal. The last three dots are taken from the consecutively evaluated dots, a line is drawn from dot D1 (third last) to dot D3 (last), and the vertical distance of dot D2 (second last) to this line is calculated. This is shown in FIG. 4. This method is an example for a simple and fast way of obtaining a measure for the jitter or fluctuations of the timing property as a measure for the cutting activity. Mathematically, this measure may simply be calculated as:

$$|\tfrac{1}{2}\cdot\text{value1} + \tfrac{1}{2}\cdot\text{value3} - \text{value2}|$$

representing the absolute value of the deviation of a dot from the average of its neighbor dots with:

value3: the last evaluated timing property (measured time value), value2: the second last evaluated timing property (measured time value), and value1: the third evaluated timing property (measured time value).

The resulting value can further be treated e.g. with a digital low pass filter. As a result, a number or value is obtained that reflects the cutting activity of the electrical shaver (measure for the cutting activity). Statistical methods may be used to conclude the number of real single cutting events out of this still relatively abstract magnitude "cutting activity". However, this is not necessary for performing a method according to the proposal.

In line with the proposal, the current that flows through the motor is used as a measure for the force applied onto skin during use of the electrical hair removal device. The motor current reflects the mechanical load of the motor. It can be interpreted as a sum of loads having different reasons. One of the contributions to this sum results from pressure of the shaver onto the skin. It can be observed that the current increases when the pressure onto the skin is increased. For this reason, it is known to use the motor current as a measure for the pressure onto the skin.

Very often, motors are driven with individual single pulses. In this case, also the charge that flows through the motor during a pulse may be used for the calculation. This is in line with the present description also denoted as motor current as is represents a value proportional to a charge over time.

However, the measurement of the motor current is disturbed because of other contributions to the current. For example, one additional contribution results from the shaver's hair cutting activity. The motor current is still a first indication for the pressure onto the skin. However, the contribution due to the shaver's hair cutting activity had to be subtracted to get an acceptable measure for the force onto the skin. Up to now, it was not possible to distinguish between the two types of load by measuring only electrical properties of the shaver's motor without extra sensors.

For determining the force of the shaver onto the skin during use (shaving), a force which might be extracted out of the motor current may be further processed in one of the following ways according to an embodiment of the proposal:

The determined force applied onto skin during use of the electrical hair removal device (shaver) based on the measured motor current is corrected dependent on the determined cutting activity. A simple way to calculate the force out of the (measured) motor current, is the following: First, an offset current is determined. This is the current that is consumed by the shaver even when there is no contact to skin or hair. To do so, it is assumed that there is a short time interval between switching on the shaver and the first contact to the skin. This offset current is e.g. measured shortly after switching on the shaver. This offset is subtracted from the motor current for all further calculations. For calculating a force out of the remaining motor current, a linear dependence of the current from the force is assumed. The proportionality factor needed to calculate the force may be obtained by a calibration. To do so, the current can be measured and the shavers force onto the skin can be measured as well. Since this has to be done only once, any force meter can be implemented in a prototype of the shaver, and reference measurements can be done during test shaves. Practical aspects such as aesthetical design, low cost or complicated readout are of little importance for such test measurements. The proportionality factor found in such test shaves may then be used for all shavers of the same type. A typical value for this proportionality factor is 3N/A (Newton/Ampere). If needed, any level of improved accuracy is possible with increased effort. E.g. a potentially nonlinear relation between force and current can be considered.

For correcting the force using the cutting activity, a simple way is to take the value of the fluctuation of the timing property, to multiply it with a weighting constant and to subtract this product from the uncorrected force. A way to obtain the best value for the weighting constant is the execution of test shaves again. In this case, shaves with many cutting events are useful. The best value for the weighting constant can be obtained by varying it until the best correlation between reference force measurement and corrected force is obtained. A typical value for the weighting constant is 26 mN/us (Milli-Newton/microsecond), assuming the formula for the fluctuation that was given earlier.

The determined force is discarded and respectively not used for any further action, if a cutting activity is determined indicating that hair cutting has occurred during measurement of the motor current.

In line with the proposal, the determined force may be corrected by subtracting a value derived from the determined cutting activity form the current value or the value obtained for the force.

According to the proposal, the determined cutting activity and/or the determined force applied onto the skin during use of an electrical hair removal device may be used for feedback information to the user and/or a device control, e.g. a feedback control loop for adapting the motor speed or supply voltage to the cutting load.

For a feedback information to the user, a sound and/or an optical signal is generated indicating the grading of the cutting activity. This may be an indication for the user that the hair removal tool (e.g. shaver or epilator) has removed hairs in this skin area or that a continued application of the hair removal device is proposed on this skin area.

In a similar way, a sound and/or an optical signal may be generated indicating the grading of the force onto the skin. This supports a correct handling of the hair removal tool by the user during use.

More in detail, as an optical feedback light can be generated by the shaver or by a connected device. The feedback may e.g. work with continuous changes. An example is a change in the color of the light, e.g. from green via yellow to red in small steps or even stepless. Optical feedback, generated by the shaver itself may also be combined with light that is used for illuminating the skin during the shave, e.g. a color change or modulation of this light. As a light source, one or more LED-elements can be used.

Acoustical feedback may be produced by a loudspeaker or by the motor of the shaver itself. This feedback may work with continuous changes as well. Feedback via the motor can e.g. be given by a shift of the frequency or speed of the motor. The amount of shift may be linked to one or both, pressure applied onto the skin and/or cutting activity.

Feedback can also be generated in the form of vibrations of different frequency or intensity. Again, a parameter of the vibrations can be linked to the measured pressure or cutting activity.

With reference to FIG. 1, an embodiment of the electrical hair removal device 1, in particular an electrical shaver or epilator, is described. The hair removal device 1 has a hair cutting unit 2 of the shaver or epilator, accordingly, an electrical motor 3 for driving the hair cutting unit 2 and a device control unit 4 for controlling the electrical motor 3. The device control unit 4 comprises a processor 5, such as a microprocessor, adapted to control and drive the electrical motor 3. The device control unit 4 is connected with a power source 6 such as a battery or secondary battery or the mains. Further, the device control unit 4 may have a control switch 7 for switching on and off the electrical hair removal device 1. The device control unit 4 comprises a measuring unit 8 for measuring the motor current and the induced voltage of the electrical motor 3, and the processor 5 is adapted to perform the proposed method, e.g. by implementing executable software on the processor 5 that—when executed by the processor 5—performs the method steps of the method described before or parts thereof.

In the case of an electrical motor 3 with several coils and an induced voltage from every coil, an effect may be observed in one or several of the induced voltage signals. In the case of a brushless motor 3 or a brushless linear motor 3 with a device control unit 4 for controlling the motor 3, a proposed embodiment can make use of the already existing electronics: The already existing device controlling unit 4 can be included in the analysis of time related properties (timing properties). In particular when the device control unit 4 already measures specific time values to generate motor driving pulses, these values may be used as timing properties of the induced voltage.

The measuring unit 8 may be integrated into the processor 5 and comprise at least one analog-digital-converter for digitizing the measured motor current and/or induced voltage.

Any comparator means, filter means and/or logic processing means can than easily be realized by suited software tools known in the art. However, the proposal may also be realized by a circuitry having comparator means, filter means, logic processing means and/or elements realized by electronic components.

According to an embodiment of the proposal, the hair removal device 1 may comprise a sound generator 9 actuated by the processor 5 to generate a sound indicating the grading of the cutting activity and/or the force onto the skin. The sound generator 9 may be a loudspeaker or a driving mode of the electrical motor, i.e. by modifying how the motor is driven. A change of the motor speed, e.g., leads to a change of the motor sound. A cheap loudspeaker can be realized with a piezo-element.

Further, according to a similar aspect of the proposal, the electrical hair removal device 1 may comprise a light generator 10 actuated by the processor 5 to generate an optical signal indicating the grading of the cutting activity and/or the force onto the skin. The light generator 10 can be a light emitting diode, for example, that can be switched on and off and the color of which may be changed dependent on the determined cutting activity and/or the force onto the skin. This feature can be used in combination with a skin illumination during use of the electrical hair removal device 1.

Figure 2:
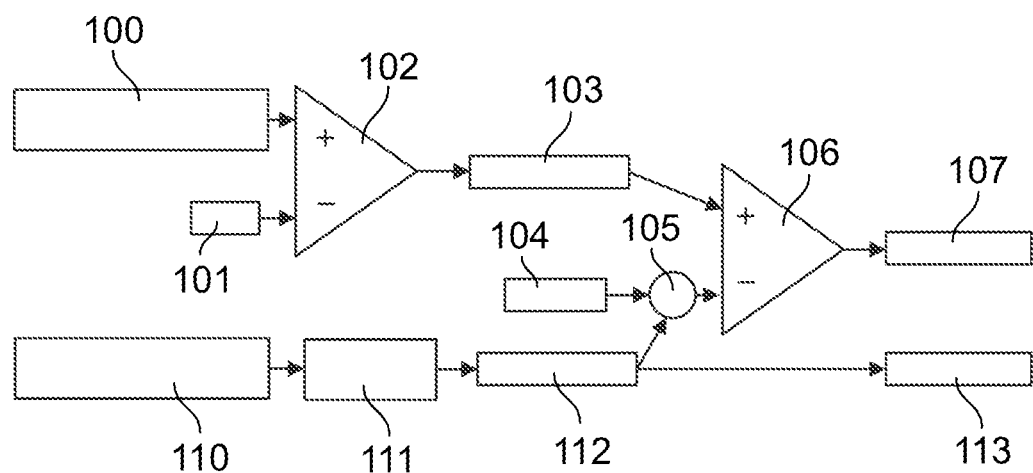
FIG. 2 shows a schematic logic setup for executing the proposed method according to an embodiment of the proposal.

FIG. 2 discloses an example of the logic setup for executing the proposed method, realized e.g. by implementation of a respective software in the processor 5 of the hair removal device 1.

In the measurement unit 8, according to a first step 100, the motor current of the electrical motor 3 is measured, e.g. by counting the motor pulse charge or by classically measuring the current flow as already described. Optionally, an offset 101 may be determined and used to be subtracted from the measured motor current in step 102. The offset corresponds to a fraction of the motor current that is present when the shaver is switched on, but does not yet have any touch to the skin and does not cut any hair. It can also be called idle current. This fraction of the motor current is not relevant for any further analysis. For this reason, it is subtracted in step 102. The value of the offset current can e.g. be measured when the shaver is just switched on, but not yet put onto the skin. The obtained current value may be low pass filtered in step 103 to average the resulting current.

In parallel, in step 110, a timing property, such as the half cycle duration, is evaluated from the measured induced voltage signal as already described in detail. The fluctuations of the timing property, such as the jitter of the half cycle duration, is calculated in the following step 111. Several possibilities for such calculation according to the proposal have already be described. The obtained fluctuation value may be low pass filtered in step 112 to average the resulting fluctuations. The value of the fluctuations determined is used as cutting activity 113.

Further, the low pass filtered fluctuations as obtained in step 112 might be weighted with a certain weight 104 in step 105, e.g. by multiplying the low pass filtered fluctuations with the weight 104. In step 106, the weighted fluctuations may be subtracted from the low pass filtered motor current from step 103 for a correction. The obtained and corrected current value 107 is a measure for the force applied onto the skin. To obtain the value for the force itself, 107 has to be multiplied with a calibration constant. Its value might be e.g. 3N/A.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A method for determining a time behavior of a cyclic motor process during use of an electrical hair removal device with a motor-driven hair cutting unit by measuring a motor current, wherein parallel to measuring the motor current, an induced voltage of the motor is measured and a timing property of the induced voltage is evaluated, wherein a duration of a periodic time pattern in the induced voltage is analyzed as the timing property of the induced voltage, wherein a cutting activity of the electrical hair removal device during use is determined based on a change of duration of the periodic time pattern of the induced voltage as compared to the periodic time pattern of the induced voltage when no cutting activity occurs.

2. The method according to claim 1, wherein the periodic time pattern is a half cycle of the induced voltage.

3. The method according to claim 2, wherein the cutting activity of the electrical hair removal device during use is determined based on a shortening of the duration of the half cycle of the induced voltage as compared to the half cycle of the induced voltage when no cutting activity occurs.

4. The method according to claim 2, wherein the cutting activity of the electrical hair removal device during use is determined based on a prolongation of the duration of the half cycle of the induced voltage as compared to the half cycle of the induced voltage when no cutting activity occurs.

5. The method according to claim 4, wherein a determined force applied onto skin during use of the electrical hair removal device based on the measured motor current is corrected dependent on the determined cutting activity.

6. The method according to claim 5, wherein the determined force is discarded if the determined cutting activity is determined to indicate that hair cutting has occurred during measurement of the motor current.

7. The method according to claim 1, wherein a force applied onto skin during use of the electrical hair removal device is determined based on the measured motor current.

8. The method according to claim 1, wherein fluctuations in the evaluated timing property during use of the electrical hair removal device are determined as a measure for the cutting activity.

9. The method according to claim 8, wherein
several timing properties of the induced voltage are continuously evaluated and stored during use of the electrical hair removal device, and
the fluctuations of the stored evaluated timing properties are quantified as the measure for the cutting activity.

10. The method according to claim 9, wherein
the last three evaluated timing properties are chosen as a function of measuring time,
a linear regression as a function of time is made with the first and the third timing properties, and
the difference between the value of the second timing property and the functional value of the linear regression for the time of measuring the induce voltage for evaluating the second timing property is quantified as measure for the cutting activity.

11. The method according to claim 1, wherein the determined cutting activity and/or the determined force applied onto the skin during use of the electrical hair removal device are used for feedback information to the user and/or a device control.

12. The method according to claim 11, wherein a sound and/or an optical signal is generated indicating the grading of the cutting activity and/or the grading of the force applied onto the skin.

13. The method according to claim 1, wherein the periodic time pattern comprises a distance in time between zero crossings of the induced voltage when changing from negative to positive values and/or from positive to negative values.

14. An electrical hair removal device with a hair cutting unit, an electrical motor and a device control unit for controlling the electrical motor, the device control unit comprising a processor adapted to control the electrical motor, wherein the device control unit comprises a measuring unit for measuring the motor current and the induced voltage of the electrical motor and the processor is adapted to perform the method according to claim 1.

15. The electrical hair removal device according to claim 14, wherein the measuring unit is integrated into the processor and comprises at least one analog-digital-converter for digitalizing the measured motor current and/or induce voltage.

16. The electrical hair removal device according to claim 14, wherein the electrical hair removal device comprises a sound generator actuated by the processor to generate a sound indicating the grading of the cutting activity and/or the force onto the skin.

17. The electrical hair removal device according to claim 2, wherein the electrical hair removal device comprises a light generator actuated by the processor to generate an optical signal indicating the grading of the cutting activity and/or the force onto the skin.

* * * * *